United States Patent
Fotouhi et al.

[11] Patent Number: 5,258,761
[45] Date of Patent: Nov. 2, 1993

[54] HIGH RESOLUTION CHARGE-REDISTRIBUTION A/D CONVERTER

[76] Inventors: Bahram Fotouhi, 10592 Esquire Pl., Cupertino, Calif. 95014; Roubik Gregorian, 1431 Graywood Dr., San Jose, Calif. 95129

[21] Appl. No.: 851,923
[22] Filed: Mar. 16, 1992
[51] Int. Cl.⁵ .............................................. H03M 1/14
[52] U.S. Cl. ..................................... 341/172; 341/156
[58] Field of Search ................. 341/156, 164, 165, 172

[56] References Cited

U.S. PATENT DOCUMENTS

| | | | |
|---|---|---|---|
| Re. 32,313 | 12/1986 | Yamakido | 341/172 |
| 4,200,863 | 4/1980 | Hodges et al. | 341/172 |
| 4,380,756 | 4/1983 | Worsman | 341/172 |
| 4,791,405 | 12/1988 | Rybicki et al. | 341/158 |
| 4,831,381 | 5/1989 | Hester | 341/172 |
| 4,908,620 | 3/1990 | Fujisawa | 341/108 |
| 5,006,853 | 4/1991 | Kiriaki et al. | 341/156 |
| 5,138,319 | 8/1992 | Tesch | 341/156 |

*Primary Examiner*—Marc S. Hoff

[57] ABSTRACT

A circuit technique to achieve 14-bit resolution in a charge-redistribution CMOS analog-to-digital converter. The sign bit plus the six most significant bits are obtained using a 6-bit capacitor array, the next five bits are determined using a resistor array, and finally the last two bits are obtained by use of a second 2-bit capacitor array. The area of the resulting 14-bit A/D converter is not appreciably larger than a corresponding 12-bit A/D converter. The 6-bit capacitor array is realized by connecting unit capacitors of a unit capacitor array. In the second capacitor array, at least one of the capacitors is realized by subdividing the unit capacitor. Since the accuracy of capacitors in the second capacitor array need not be as great as the accuracy of capacitors in the 6-bit capacitor array, subdividing the unit capacitor does not affect the accuracy of the converter.

11 Claims, 1 Drawing Sheet

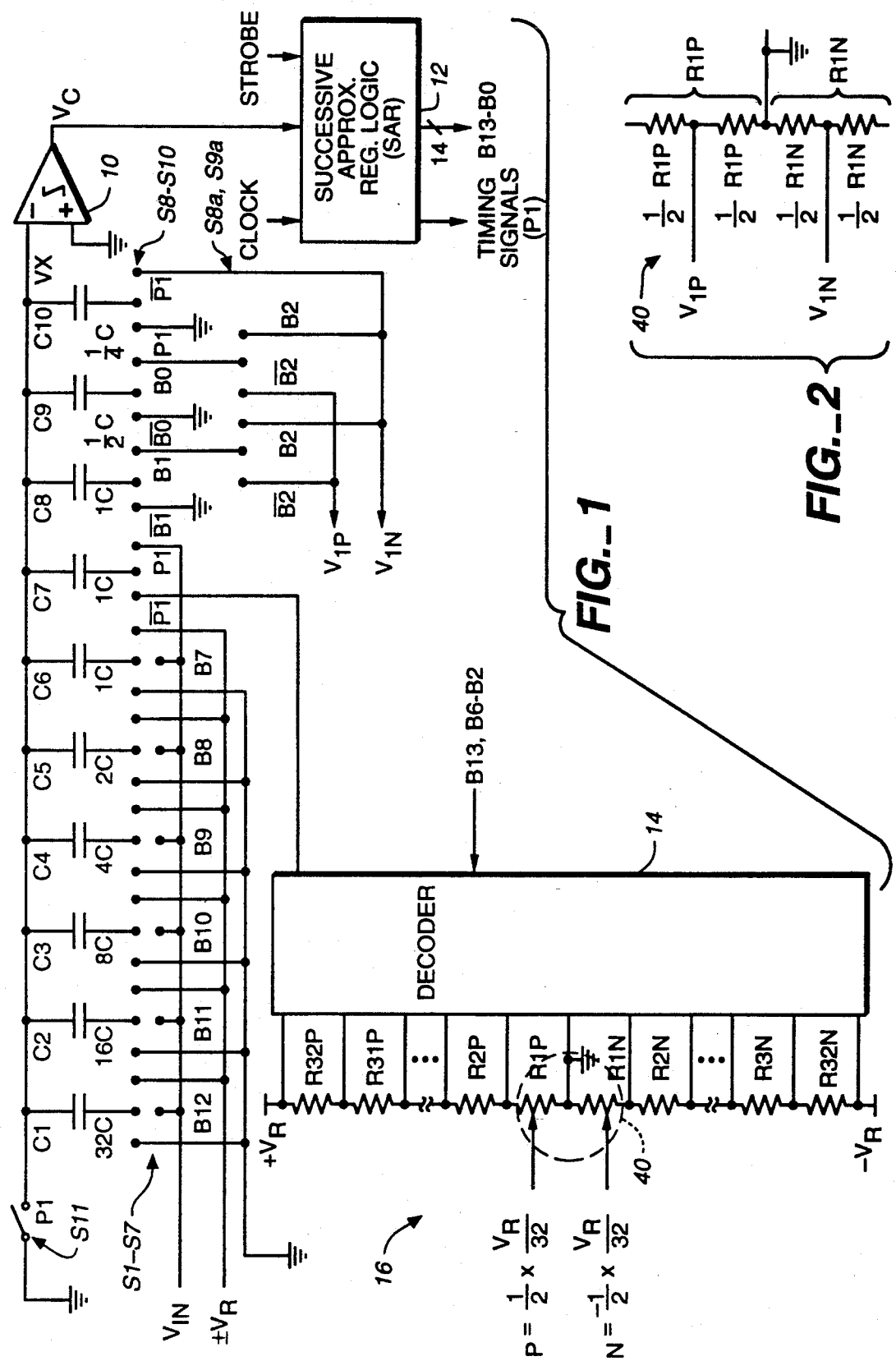
FIG._1
FIG._2

HIGH RESOLUTION CHARGE-REDISTRIBUTION A/D CONVERTER

BACKGROUND OF THE INVENTION

1. Field of Invention

The present invention relates to analog-to-digital (A/D) converters and more particularly to a charge redistribution A/D converter in which the resolution of the converter may be extended without appreciably increasing the area occupied by the A/D converter on an integrated circuit chip.

2. State of the Art

Successive approximation A/D converters are well-known in the art. In general terms, such A/D converters use a collection of binary-weighted capacitors, resistors or some combination thereof successively switched into and/or out of the circuit so as to compare an unknown analog input voltage with binary-weighted fractions of a reference voltage. To form a collection of binary-weighted capacitors or resistors on an integrated circuit chip, typically an array of unit capacitors or unit resistors each having some specified minimum size is formed, after which the unit capacitors or unit resistors are suitably interconnected to form a collection of binary-weighted capacitors or resistors. The unit capacitor or unit resistor size is chosen in order to meet the accuracy requirements of the A/D converter in the face of process variations. For example, a unit capacitor is typically formed by a nominally square area of metal or polysilicon deposited on an integrated circuit wafer. Because of process imperfections, however, the edges of the metal or polysilicon area may, instead of being perfectly straight, exhibit some waviness, such that the actual capacitance of the unit capacitor will vary somewhat from the design value.

In a typical charge-redistribution A/D converter using a collection of binary-weighted capacitors, a least-significant bit of digital output is produced using a capacitor formed from a single unit capacitor, and the most-significant bit is produced using a capacitor formed from $2^{n-1}$ interconnected unit capacitors where n is the resolution, or number of output bits, of the A/D converter. Mathematically it may be shown that, to meet the accuracy requirements of the converter (viz., the digital output accurately reflecting the analog input to within $\pm \frac{1}{2}$ LSB), the capacitor used to produce the least-significant bit may have a tolerance of 50%, the capacitor used to produce the next-significant bit must have a tolerance of 25%, and so forth, such that the capacitor used to produce the most-significant bit is required to have a tolerance of $100/2^n\%$. For a 12-bit converter (n=12), the capacitor used to produce the most-significant bit must have a tolerance of 0.02%. Given a particular process, this strict tolerance imposes a severe limit on process variations as well as a minimum limit on the size of the unit capacitors. That is to say, if the unit capacitor is made very small, the variation in area (capacitance) produced by the waviness of the edge of the metal square will be greater than if the unit capacitor is made larger.

For every additional bit of resolution desired from the A/D converter, the number of unit capacitors must be doubled, substantially doubling the size of the A/D converter. The size penalty incurred to achieve higher resolution is therefor severe. What is needed is a way to increase the resolution of the A/D converter with a minimum increase in size while maintaining the required accuracy of the converter.

SUMMARY OF THE INVENTION

According to the present invention, an A/D converter integrated circuit includes a voltage comparator, an array of unit capacitors interconnected to form a first number of capacitors weighted such that the capacitance of a given capacitor is equal to the sum of the capacitances of all lesser capacitors, and a second number of binary-weighted capacitors, a greatest one of the second number of binary-weighted capacitors having a capacitance no greater than a capacitance of one of the unit capacitors of which the first number of capacitors is formed. One plate of each of the first number of capacitors and the second number of capacitors is connected in common to an input of the voltage capacitor. Switches connect another plate of each of the first number of capacitors and the second number of capacitors to one of circuit ground and a voltage proportional to a reference voltage. Control logic means is responsive to the voltage comparator for controlling the switches. A voltage divider apparatus produces different voltage signals proportional to the reference voltage, and the second number of binary-weighted capacitors have their bottom plates connected by the switches to either circuit ground or one of the voltage signals nearest circuit ground. The least voltage signal connected to the bottom plates of the first number of capacitors, on the other hand, is at least twice as great as the voltage signal nearest circuit ground. In an exemplary embodiment, two additional bits of resolution may therefore be obtained in the space of less than two additional unit capacitors by providing, as the second number of binary-weighted capacitors, a first capacitor having a capacitance equal to the unit capacitance and a second capacitor having half the capacitance of the unit capacitance. A capacitor having $\frac{1}{4}$ the capacitance of the unit capacitance is also provided and is used to shift the analog input voltage by an amount represented by $\frac{1}{2}$ the least significant bit in order to perform sign-magnitude to 2's complement conversion.

BRIEF DESCRIPTION OF THE DRAWING

FIG. 1 is a schematic block diagram of a preferred embodiment of A/D converter of the present invention;
FIG. 2 is a more detailed illustration of a portion of FIG. 1.

DETAILED DESCRIPTION OF THE PREFERRED EMBODIMENTS

Referring now to the Figure, showing a preferred embodiment of the increased-resolution A/D converter of the present invention, the converter includes a first group of capacitors C1, C2, ..., C7 weighted such that the capacitance of a given capacitor is equal to the sum of the capacitances of all lesser capacitors. The capacitance value of each capacitor in terms of a unit capacitance C is listed below each capacitor. It may be seen that C1, having a capacitance of 32C, is equal to C2+C3+ ... +C7, having a total combined capacitance also of 32C. Similarly, C2=C3+C4+...+C7, and so forth.

The converter also includes a second group of capacitors C8, C9 and C10 that are binary-weighted. A greatest one, C8, of the second group of capacitors has a capacitance equal to a least one C7 of the first group of capacitors, both having the capacitance of the unit capacitor. The capacitor C9 has a capacitance of ½C equal to half the capacitance of the capacitor C8, and the capacitor C10 has a capacitance of ¼C equal to half the capacitance of the capacitor C9.

The top plates of all the capacitors C1–C10 are connected in common to the negative input of a voltage comparator 10. The top plates of the capacitors may also be connected to circuit ground through a switch S11 under the control of a signal P1. The positive input of the voltage comparator is connected to circuit ground. The bottom plate of all of the capacitors C1–C10 may be connected through switches S1–S10 (not explicitly shown) to circuit ground or to a voltage proportional to a reference voltage $V_R$. In the case of the first group of capacitors C1–C7, the bottom plates of these capacitors may also be connected through the switches to an analog input voltage $V_{in}$.

Although the bottom plates of all of the capacitors may be connected through the switches to a voltage proportional to a reference voltage $V_R$, the specific proportion varies between the capacitors as follows. The capacitors C1–C6 may be connected to $\pm V_R$. Hence, for these capacitors, the proportionality factor is unity. The capacitor C7 may be connected to $nV_R/32$ where n may assume any integer value from $-32$ to $+31$ (zero inclusive). Hence, for C7 the proportionality factor may have any one of 64 different values. The voltage signals corresponding to each of these values are produced using a voltage divider circuit 16.

The voltage divider circuit 16 uses a chain of 64 equal-valued resistors connected in series, 32 resistors designated R1P–R32P being connected between $+V_R$ and circuit ground, and 32 resistors designated R1N–R32N being connected between circuit ground and $-V_R$. Taps are taken on both sides of each of the resistors and the resulting voltage signals input to an analog decoder 14 which is controlled to select the appropriate voltage signal.

The capacitors C8 and C9 may be connected to $+V_R/64$, designated $V_{1P}$, or to $-V_R/64$, designated $V_{1N}$. The voltage signal $V_{1P}$ and $V_{1N}$ are produced at center taps of resistors R1P and R1N, respectively. (The portion of the circuit indicated by reference numeral 40 in FIG. 1 is shown in greater detail in FIG. 2.) Finally, the capacitor C10, if it is not connected to circuit ground, may be connected to the voltage signal $V_{1N}$ only.

The connections of each of the capacitors are controlled by a successive approximation register logic circuit (SAR) 12 responsive to the output $V_C$ of the voltage comparator 10. A strobe signal input to the SAR directs the A/D converter to begin a conversion, and a clock input signal causes the SAR to sequentially step through each step of the conversion operation. The SAR outputs timing signals for controlling the operations of the A/D convertor including a signal P1 that causes the analog input voltage $V_{in}$ to be sampled. The SAR produces as a final output a digital word representative of the analog input voltage signal. In an exemplary embodiment, the digital output word is 14 bits wide, the bits being designated $B_{13}$ through $B_0$ where $B_{13}$ is a sign bit, $B_{12}$ is the most significant magnitude bit and $B_0$ is the least significant magnitude bit. By appropriately modifying the SAR logic, the connection of capacitors C8–C10 may be varied slightly such that each of these capacitors is connected to the same one of either $V_{1P}$ or $V_{1N}$ depending on the sign bit. The operational details of such a modification will be apparent to one of ordinary skill in the art.

With the exception of capacitors C8, C9 and C10 together with their associated circuitry, the operation of the A/D converter thus far described will be familiar to one of ordinary skill in the art. Briefly, to perform A/D conversion by successive approximation, capacitors, resistors or a combination thereof may be used. In an exemplary embodiment, capacitors C1–C6 are used to obtain the most significant six magnitude bits B12–B7, and capacitor C7 is used in conjunction with the voltage divider circuit 16 to obtain the five next most significant bits B6–B2.

When a strobe signal has been received directing the start of an A/D conversion operation, a signal P1 is issued from the SAR to cause the top plates of the capacitors to be grounded through the switch S1 and the bottom plates of the capacitors C1–C7 to be connected through the switches S1–S7 to the analog input voltage $V_{in}$ to sample the input voltage. The sample command P1 is then deasserted, causing the switch S11 to open. During a subsequent sign-bit (or input voltage reversal) phase, the bottom plates of capacitors C1–C7 are connected through the switches S1–S7 and the decoder 14 to ground, causing the negative of the analog input voltage, $-V_{in}$, to appear at the negative input of the voltage comparator 10 as $V_X$.

According to whether the analog input voltage is positive or negative, the output signal $V_C$ of the voltage comparator 10 will exhibit a positive or negative transition, in response to which the SAR sets the sign bit (B13) in the successive approximation register appropriately. The sign bit in turn determines whether a positive or negative reference voltage $V_R$ will be used during the remainder of the conversion operation. If the sign bit is positive, then $+V_R$ is made available to the bottom plates of capacitors C1–C6, and the decoder 14 selects a voltage signal from among the positive voltage signals for capacitors C7–C9. If the sign bit is negative, then $-V_R$ is made available to the bottom plates of the capacitors C1–C6, and the decoder 14 selects a voltage signal from among the negative voltage signals for capacitors C7–C9. Capacitor C10 is switched to $-1/64$ $V_R$ irrespective of sign bit B13 for sign-magnitude to two's complement conversion.

To determine the most significant magnitude bit, the bottom plate of capacitor C1 is switched from ground to the reference voltage $V_R$ causing the voltage $V_X$ to shift by ½ the reference voltage. If no transition is observed in the output signal $V_C$ of the voltage comparator 10, then the input voltage is greater than ½ the reference voltage, and the bottom plate of the capacitor C1 remains connected to the reference voltage $V_R$ while the bottom plate of the capacitor C2 is switched from ground to the reference voltage $V_R$ as well. If a transition is observed in the output signal $V_C$, then the input voltage is less than ½ the reference voltage, the bottom plate of the capacitor C1 is returned to ground, and the bottom plate of the capacitor C2 is switched to the reference voltage. Operation proceeds in this manner through capacitor C6, whereby the six most significant magnitude bits are accumulated in the successive approximation register.

The capacitor C7 operates differently from the capacitors C1–C6. Instead of producing a single magnitude bit, the capacitor C7 operates in conjunction with the voltage divider circuit 16 to produce five magnitude bits. Since the tolerances on the voltage increments added to the voltage $V_X$ are greatly relaxed at this point in the conversion, resistors, which are typically lower precision than capacitors, may be used to augment the operation of the capacitor C7.

When integrated on a semiconductor chip, resistors are typically formed by elongated regions of doped semiconductor having a periphery relatively large in relation to the enclosed area, as opposed to the generally square regions used to form capacitors, which regions have a relatively small periphery in relation to the enclosed area. Accordingly, the waviness of edges defined on the semiconductor chip has a greater adverse affect on the precision of resistors than of capacitors. The precision of the resistors is sufficiently good, however, to allow them to be used in determining lower order bits B6–B2 in the illustrated embodiment.

The aforementioned bits B6–B2 are determined using the capacitor C7 in conjunction with the voltage divider circuit 16 in the following manner. When the sampling command P1 goes low following the initial sampling phase of the conversion cycle, the bottom plate of the capacitor C7 is connected to the output of the decoder 14 which is set to select circuit ground. When the time arrives for the capacitor C7 to participate in the conversion, the sign bit B13 is used to select a voltage signal midway between circuit ground and $+V_R$ if the sign bit is positive or midway between circuit ground and $-V_R$ if the sign bit is negative. Accordingly, the voltage $V_X$ is shifted by half the amount as in the case of the capacitor C6 even though capacitor C6 and capacitor C7 have the same capacitance, namely the unit capacitance. The bit B is thereby determined and is input to the decoder 14 to select a further voltage signal, either ¾ of the way between circuit ground and the reference voltage or ¼ of the way between circuit ground and reference voltage depending on the value of B6. Operation proceeds in this fashion until five bits B6–B2 have been produced.

Using the techniques of the prior art, for each additional bit of resolution desired, either the total capacitance would have to be doubled, doubling the required number of unit capacitors, or the number of resistors would have to be doubled. In either case, the size of the overall A/D converter greatly increases. According to the present invention, additional bits of resolution may be obtained with an essentially negligible increase in the size of the A/D converter.

In the illustrated embodiment, two additional bits of resolution are obtained to realize a 14-bit A/D converter in the same area as a comparable 12-bit A/D converter. Of the capacitors C8, C9 and C10, included in the second capacitor array, the capacitor C8 has a capacitance equal to the unit capacitance. In the case of the capacitors C9 and C10, since the required accuracy of the capacitors are 25% and 50% respectively to achieve ½ LSB accuracy in the converter characteristics, these capacitors are realized by sub-dividing the unit capacitor. The capacitor C9 therefore has a capacitance of half the unit capacitance, and the capacitor C10 has a capacitance of ¼ the unit capacitance. The increment by which the voltage $V_X$ is shifted is further divided in half by connecting the bottom plates of the capacitors C8–C10 to a center tap point of the appropriate one of the resistors R1P and R1N. Thus, if the bit B2 is 0, indicating that the voltage $V_X$ should be incremented positively, the switches S8a and S8b are connected to the center tap of the resistor R1P producing a voltage $V_{1P}$. Conversely, if the bit B2 is 1 indicating that the voltage $V_X$ should be decremented, then the switches S8a and S8b are connected to the center tap of the resistor R1N producing a voltage $V_{1N}$. The switch S8 then connects the bottom plate of the capacitor C8 to the appropriate one of $V_{1P}$ and $V_{1N}$. Depending on the output $V_C$ of the voltage comparator 10, the switch S8 either remains as it is or is switched to ground. The switch S9 associated with capacitor C9 is controlled in the same manner to produce the least significant magnitude bit, B0.

The capacitor C10 does not produce an additional magnitude bit. Instead, the bottom plate of the capacitor C10 is grounded during the sampling phase and is connected to $V_{1N}$ otherwise. The result is to produce a ½ LSB shift of the input voltage in the positive direction to achieve sign-magnitude to 2's complement conversion.

The foregoing has described a novel circuit technique to achieve 14-bit resolution in a charge-redistribution CMOS A/D converter. The sign bit plus the six most significant bits are obtained using a 6-bit capacitor array, the next five bits are determined using a resistor array, and finally the last two bits are obtained by use of a second 2-bit capacitor array. Using this technique, the area of the 14-bit A/D converter is not appreciably larger than a corresponding 12-bit A/D converter. The same technique may also be used for A/D converters of different resolutions.

It will be apparent to those of ordinary skill in the art that the present invention may be embodied in other specific forms without departing from the spirit or essential character thereof. The disclosed embodiments are therefore considered in all respects to be illustrative and not restrictive. The scope of the invention is indicated by the appended claims rather than the foregoing description, and all changes which come within the meaning and range of equivalence thereof are intended to be embraced therein.

What is claimed is:

1. An A/D converter integrated circuit comprising:
   a voltage comparator;
   a first plurality of capacitors having capacitances forming a non-decreasing series with a given capacitance being equal to the sum of all preceding capacitances in the series;
   a second plurality of binary-weighted capacitors, a greatest one of said second plurality of capacitors having a capacitance no greater than a first capacitance in said series, one plate of each of said first plurality of capacitors and said second set of capacitors being connected in common to an input of said voltage comparator;
   a plurality of switches for connecting another plate of each of said first plurality of capacitors and said second plurality of capacitors to one of circuit ground and a voltage proportional to a reference voltage;
   control logic means responsive to said voltage comparator for controlling said switches; and
   voltage divider means for producing a plurality of different voltage signals proportional to said reference voltage, said second plurality of binary-weighted capacitors each having said another plate connected by said switches to one of circuit ground and one of said voltage signals nearest circuit ground.

2. The apparatus of claim 1 wherein a least voltage signal connected to said another plate of any of said first plurality of capacitors is at least twice as great as said one of said voltage signals nearest circuit ground.

3. The apparatus of claim 2 wherein said voltage divider means comprises a plurality of resistors series-connected to form a chain of resistors, said chain of resistors being connected at a mid-point thereof to circuit ground, at one end thereof to said reference voltage and at another end thereof to the negative of said reference voltage.

4. The apparatus of claim 3, wherein said voltage divider means further comprises means connected to said chain of resistors and to one of said plurality of switches corresponding to a least one of said first plurality of capacitors to connect said another plate of said least one of said first plurality of capacitors to any one of said voltage signals other than a pair of said voltage signals nearest circuit ground.

5. An A/D converter comprising:
analog comparator means for comparing an analog voltage to circuit ground;
charge redistribution means connected to said analog comparator means and including a plurality of capacitors weighted such that the capacitance of a given capacitor is equal to the sum of the capacitances of all lower-valued capacitors, for sampling an analog input voltage to produce a sampled voltage and for successively varying said sampled voltage by binary-weighted fractions of a reference voltage;
voltage divider means connected to said charge redistribution means for dividing said reference voltage and scaling down said binary-weighted fractions of said reference signal, said voltage divider means producing a plurality of different voltage signals proportional to said reference voltage and inputting a selected one of said voltage signals to said charge redistribution means;
an additional capacitor having a capacitor value no greater than a least capacitance value of said capacitors, one plate of said additional capacitor being connected to said analog converter means and another plate of said additional capacitor being switchably connected to either circuit ground or one of said voltage signals nearest circuit ground; and
logic means responsive to said analog comparator means for controlling said charge redistribution means and selecting said voltage signal input to said charge redistribution means and for accumulating a digital word representative of said analog input voltage.

6. A method of increasing the resolution of a successive approximation A/D converter, having a voltage comparator and a resistor array formed from n resistors each having substantially a same resistance and series connected between a reference voltage $V_R$ and circuit ground, each resistor producing a voltage $(m/n)V_R$ when m is an integer from one to n, the method comprising the steps of:
in place of one of said resistors, forming a plurality of smaller value resistors having a resistance that is a fraction of said same resistance; and
comparing in turn a voltage proportional to a voltage produced by each of said plurality of smaller value resistors with respect to an unknown analog input voltage using said voltage comparator.

7. A successive approximation A/D converter, comprising:
a voltage comparator;
a resistor array formed from a first plurality of resistors each having substantially a same resistance and being series connected;
a second plurality of resistors each having a resistance that is a fraction of said same resistance, said first plurality of resistors and said second plurality of resistors being series connected between a reference voltage and circuit ground with said second plurality of resistors being connected nearest circuit ground; and
means for comparing in turn a voltage proportional to a voltage produced by each of said first plurality of resistors and said second plurality of resistors with respect to an unknown analog input voltage using said voltage comparator.

8. A method of realizing an M-bit A/D converter of the capacitor-array, charge-redistribution type without substantially increasing a size of said capacitor array over that a of a comparable N-bit A/D converter where $M-N \geq 1$, comprising the steps of:
providing an array of unit capacitors;
interconnecting said unit capacitors to provide a first capacitor array comparable to a capacitor array of said comparable N-bit A/D converter;
providing in addition to said capacitor array at least one capacitor formed so as to have a capacitance that is a fraction of a capacitance of each of said unit capacitors;
providing a second capacitor array including at least two capacitors, one of said two capacitors being said one capacitor;
providing a resistor array comparable to a resistor array of said comparable N-bit A/D converter;
forming in place of at least one resistor of said resistor array two smaller resistors; and
switchably interconnecting a node between said two smaller resistors to at least one of said two capacitors.

9. An A/D converter circuit comprising:
a first array of capacitors formed from capacitive elements each having a first physical size;
at least one additional capacitor formed from at least one capacitive element having a physical size smaller than said first physical size, said additional capacitor having a capacitance less than a capacitor having a least capacitance of capacitors in said first array;
comparator means connected to one plate of each of said capacitors in said first array and of said additional capacitor;
means for producing a plurality of voltages, a magnitude of difference between at least one of said voltages and a next higher voltage, and magnitude of a difference between said one voltage and a next lower voltage, being substantially equal;
means for sequentially connecting a plurality of said voltages to another plate of said capacitor having a least capacitor of capacitors in said first array; and
means for connecting one of said voltages of at least magnitude to another plate of said additional capacitor.

10. An A/D converter circuit comprising:
an array of capacitors;
comparator means connected to one plate of each of said capacitors;
an array of resistors connected in series;

at least one additional resistor having a resistance less than a resistor having a least resistance of resistors in said array, said array of resistors and said additional resistor being series connected in a voltage divider configuration;

means for sequentially connecting a plurality of voltages produced by said array of resistors to another plate of one of said capacitors; and means for connecting a voltage produced by said additional resistor to another plate of another of said capacitors having a capacitance less than said one of said capacitors.

11. An A/D converter circuit comprising:

a first array of capacitors formed from capacitive elements each having a first physical size;

at least one additional capacitor formed from at least one capacitive elements having a physical size smaller than said first physical size, said additional capacitor having a capacitance less than a capacitor having a least capacitance of capacitors in said first array;

comparator means connected to one plate of each of said capacitors in said first array and of said additional capacitor;

an array of resistors connected in series;

at least one additional resistor having a resistance less than a resistor having a least resistance of resistors in said array, said array of resistors and said additional resistor being series connected in a voltage divider configuration;

means for sequentially connecting a plurality of voltages produced by said array of resistors to another plate of said capacitor having a least capacitance of capacitors in said first array; and means for connecting a voltage produced by said additional resistor to another plate of said additional capacitor.

* * * * *